(12) United States Patent
Sethumadhavan et al.

(10) Patent No.: US 6,994,896 B2
(45) Date of Patent: Feb. 7, 2006

(54) LIQUID CRYSTALLINE POLYMER COMPOSITES, METHOD OF MANUFACTURE THEREOF, AND ARTICLES FORMED THEREFROM

(75) Inventors: Murali Sethumadhavan, Shrewsbury, MA (US); Richard T. Traskos, Brooklyn, CT (US); Michael E. St. Lawrence, Thompson, CT (US); Sankar K. Paul, Branford, CT (US); Luis D. Borges, Pomfret Center, CT (US); Allen F. Horn, III, Pomfret Center, CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

(21) Appl. No.: 10/663,375

(22) Filed: Sep. 16, 2003

(65) Prior Publication Data
US 2004/0124405 A1 Jul. 1, 2004

Related U.S. Application Data

(60) Provisional application No. 60/411,212, filed on Sep. 16, 2002.

(51) Int. Cl.
- C09K 19/00 (2006.01)
- B32B 3/00 (2006.01)
- H05K 1/00 (2006.01)

(52) U.S. Cl. .................. 428/1.6; 428/1.62; 428/209; 428/297.4; 428/325; 428/327; 174/258

(58) Field of Classification Search ............ 428/209, 428/901, 1.6, 1.62, 297.4, 325, 327; 174/258
See application file for complete search history.

(56) References Cited

U.S. PATENT DOCUMENTS

| | | | |
|---|---|---|---|
| 3,240,662 A | 3/1966 | Smyers et al. | |
| 3,526,568 A | 9/1970 | Kepple et al. | |
| 4,737,398 A | 4/1988 | Ikenaga et al. | 428/216 |
| 4,802,061 A | 1/1989 | Portugall et al. | |
| 4,871,595 A | 10/1989 | Lusignea et al. | 428/1 |
| 4,876,120 A | 10/1989 | Belke et al. | |
| 4,886,699 A * | 12/1989 | Carroll et al. | 442/235 |
| 4,904,752 A | 2/1990 | Kanoe et al. | |
| 4,963,428 A | 10/1990 | Harvey et al. | 428/220 |
| 4,966,806 A | 10/1990 | Lusignea et al. | 428/220 |
| 4,966,807 A | 10/1990 | Harvey et al. | |
| 4,975,312 A | 12/1990 | Lusignea et al. | |
| 5,055,342 A * | 10/1991 | Markovich et al. | 428/137 |
| 5,079,289 A | 1/1992 | Layton et al. | |
| 5,085,015 A | 2/1992 | Adcock | |
| 5,147,967 A | 9/1992 | Stern et al. | |
| 5,164,458 A | 11/1992 | Jennings et al. | 525/389 |

(Continued)

FOREIGN PATENT DOCUMENTS

CA 2273542 12/1999

(Continued)

OTHER PUBLICATIONS

JP 06 252555 (Sep. 9, 1994) Japan (abstract only).

(Continued)

*Primary Examiner*—Cathy F. Lam
(74) *Attorney, Agent, or Firm*—Cantor Colburn LLP

(57) ABSTRACT

A liquid crystalline composite comprising a liquid crystalline polymer, particulate filler, and fibrous web. Further disclosed is a method for forming the liquid crystalline polymer composite. The liquid crystalline polymer composite is useful in circuit materials, circuits, and multi-layer circuits, economical to make, and has excellent flame retardant properties.

19 Claims, 2 Drawing Sheets

U.S. PATENT DOCUMENTS

| | | | |
|---|---|---|---|
| 5,204,417 A | 4/1993 | Stern et al. | |
| 5,216,092 A | 6/1993 | Huspeni et al. | |
| 5,288,529 A | 2/1994 | Harvey et al. | 428/1 |
| 5,296,542 A | 3/1994 | Layton et al. | |
| 5,303,862 A | 4/1994 | Bross et al. | |
| 5,360,647 A | 11/1994 | Sumida | |
| 5,360,672 A | 11/1994 | Saito et al. | 428/480 |
| 5,428,100 A | 6/1995 | Asai et al. | |
| 5,459,190 A | 10/1995 | Nakamura et al. | |
| 5,490,319 A | 2/1996 | Nakamura et al. | |
| 5,529,740 A | 6/1996 | Jester et al. | |
| 5,545,475 A | 8/1996 | Korleski | |
| 5,571,608 A | 11/1996 | Swamy | 428/246 |
| 5,571,609 A | 11/1996 | St. Lawrence et al. | 428/268 |
| 5,643,988 A | 7/1997 | Nakamura et al. | |
| 5,677,045 A * | 10/1997 | Nagai et al. | 442/294 |
| 5,681,624 A | 10/1997 | Moriya | |
| 5,703,202 A | 12/1997 | Jester et al. | |
| 5,709,957 A | 1/1998 | Chiang et al. | 428/615 |
| 5,719,354 A | 2/1998 | Jester et al. | |
| 5,843,562 A | 12/1998 | Onodera et al. | |
| 5,847,039 A | 12/1998 | Nagashima et al. | |
| 5,900,292 A | 5/1999 | Moriya | 428/1 |
| 5,904,797 A | 5/1999 | Kwei | |
| 6,017,971 A | 1/2000 | Mizoguchi et al. | |
| 6,027,771 A | 2/2000 | Moriya | |
| 6,124,004 A * | 9/2000 | Furuta et al. | 428/1.1 |
| 6,140,410 A | 10/2000 | Kolouch | 524/520 |
| 6,166,138 A | 12/2000 | Kolouch | 525/166 |
| 6,274,242 B1 | 8/2001 | Onodera et al. | |
| 6,287,702 B1 | 9/2001 | Kolouch | 428/463 |
| 6,306,946 B1 | 10/2001 | Long et al. | |
| 6,312,814 B1 | 11/2001 | Kolouch | 428/421 |
| 6,334,922 B1 | 1/2002 | Tanaka et al. | |
| 6,528,145 B1 * | 3/2003 | Berger et al. | 428/156 |
| 6,593,255 B1 * | 7/2003 | Lawton et al. | 442/59 |
| 2002/0074158 A1 | 6/2002 | St. Lawrence et al. | |
| 2002/0076538 A1 | 6/2002 | St. Lawrence et al. | |
| 2002/0081443 A1 | 6/2002 | Connelly et al. | |

FOREIGN PATENT DOCUMENTS

| | | |
|---|---|---|
| EP | 0 697 278 A1 | 2/1996 |
| EP | 0740013 A1 | 10/1996 |
| EP | 0949067 A2 | 10/1999 |
| JP | 06 252555 | 9/1994 |
| JP | 11-309803 | 11/1999 |
| JP | 11309803 | 11/1999 |
| JP | 2001079946 | 3/2001 |
| JP | 2001-244630 | 9/2001 |
| WO | WO 00/02975 | 1/2000 |

OTHER PUBLICATIONS

International Search Report mailing date Dec. 1, 2004, International Appln. No. PCT/US03/28965, International Filing Date Oct. 16, 2003.

JP 10157010. Publication No. 1998-06-16. Abstract Only (1 page).

"Rogers ZYVEX TM Liquid Crystalline Polymer Circuit Mataerial". Rogers Corporation., Advanced Circuit Materials Data Sheet, Revision Feb. 27, 2002. 0620-0202-0.3-CC, Publication #14-019, 2 pages.

Kuraray. Press: Proceedings of the 13th JIEP Annual Meeting. Date of Issue: Mar. 3, 1999. pp. 95-96. English Translation Attached (5 pgs.).

Kuraray. Press: Electronic Surface Mounting Technology. Date of Issue: Jun. 1, 1997. vol. 7. No. 6, pp. 54-55. English translation attached (4 pgs.).

Kuraray. Press: Electronic Parts and Materials. Date of Issue: Oct. 1, 2000. vol. 39, No. 10, pp. 44-46. English Translation attached (12 pgs.).

Japanese Patent Application No. JP11309803; Publication Date: Nov. 9, 1999; Abstract Only; 1 page.

"Rogers ZYVEX Liquid Crystalline Polymer Circuit Material", Rogers Corporation, Data Sheet, Feb. 27, 2002, 2 pages.

"Vectra, Liquid Crystal Polymer (LCP)", Ticona Product Brochure, 20 pages; www. Ticona.com; Sep. 2001 p. 12 ¶2.1.5 & 2.1.6.

* cited by examiner

LIQUID CRYSTALLINE POLYMER COMPOSITES, METHOD OF MANUFACTURE THEREOF, AND ARTICLES FORMED THEREFROM

CROSS-REFERENCE TO RELATED APPLICATIONS

This application claims the benefit of U.S. Provisional Application Ser. No. 60/411,212, filed Sep. 16, 2002, which in incorporated by reference herein in its entirety.

BACKGROUND OF INVENTION

This invention relates to liquid crystalline polymer composites and in particular to liquid crystalline polymer composites useful as dielectric substrates in circuit materials, circuits, and multi-layer circuits.

As used herein, a circuit material is an article used in the manufacture of circuits and multilayer circuits, and includes circuit laminates, bond plies, conductive layers, resin coated conductive layers, and cover films. Circuit laminates, bond plies, resin coated conductive layers, and cover films comprise dielectric materials formed from a thermosetting or thermoplastic polymer. The dielectric material in a bond ply, resin covered conductive layer, or cover film may comprise a substantially non-flowable dielectric material, i.e., one that soften or flows during manufacture but not use of the circuit The dielectric material in a circuit laminate (i.e., a dielectric substrate), in contrast is designed to not soften or flow during manufacture or use of the circuit or multi-layer circuit. Dielectric substrate materials are further typically divided into two classes, flexible and rigid. Flexible dielectric substrate materials generally tend to be thinner and more bendable than the so-called rigid dielectric materials, which typically comprise a fibrous web or other forms of reinforcement, such as short or long fibers or fillers.

Circuit laminates further have a conductive layer fixedly attached to a dielectric substrate layer. When a second conductive layer is disposed on the other side of the dielectric layer, the material is often referred to as a double clad circuit laminate. Patterning a conductive layer of a circuit laminate, for example by etching, provides a circuit, or in the case of a double clad circuit laminate, a double clad circuit. One or both of the conductive layers of a double clad laminate may be processed to provide circuit layers.

The aforementioned circuit materials and circuits may be combined in various configurations to provide multilayer circuits. "Multilayer circuits" as used herein refers to materials having at least two dielectric layers and at least two conductive layers, wherein at least one of the conductive layers is circuitized, and is inclusive of both subassemblies used to form finished circuits and the finished circuits themselves.

In one simple form, a multilayer circuit includes a double clad circuit and a resin coated conductive layer, wherein the dielectric material of the resin coated conductive layer is disposed on a circuit layer of the double clad circuit. In another simple form, a multilayer circuit includes a first circuit and a second circuit joined by a bond ply disposed between the circuit layer of the first circuit and the dielectric substrate of the second circuit. Typically, such multilayer circuits are formed by laminating the circuit(s) and/or circuit material(s) in proper alignment using heat and/or pressure. Bond plies can be used to provide adhesion between circuits and/or between a circuit and a conductive layer, or between two conductive layers. In place of a conductive layer bonded to a circuit with a bond ply, the multilayer circuit may include a resin coated conductive layer bonded directly to the outer layer of a circuit. In such multilayer structures, after lamination, known hole forming and plating technologies may be used to produce useful electrical pathways between conductive layers.

Dielectric materials are typically divided into two classes, flexible and rigid. Flexible dielectric materials generally tend to be thinner and more bendable than the so-called rigid dielectric materials, which typically comprise a fibrous web or other forms of reinforcement. While there are a variety of rigid circuit materials available today, for example, FR4 epoxy glass laminates, and the like, there is a growing demand for circuit materials for high performance (high frequency) applications, that is, applications operating at 1 gigahertz (GHz) or higher. High performance applications require, among other things, circuit materials having low dielectric constants for low propagation delay, lower cross talk and higher clock rates, low dissipation factor (Df) for low attenuation, better signal integrity, and lower power consumption in portables. In addition, the circuit should be non-flammable, preferably achieving a rating of V-1 or better in the Underwriter's Laboratory UL-94 flammability test. In addition, the circuit materials preferably have low coefficients of thermal expansion (CTE) in all directions to provide good dimensional stability and enhanced reliability, e.g., plated through-hole reliability. The circuit materials further preferably have excellent copper peel strength, particularly at high temperature.

While there are now many materials, such as the RO4350 made by Rogers Corporation, which satisfy these properties, they all contain halogenated additives to achieve the desired level of flame retardancy. As use of halogenated flame retardants is being phased out for environmental reasons, it has become apparent that new rigid dielectric materials are needed for use in circuits, and in particular new rigid dielectric materials that have acceptable high performance at high frequencies as described above and are flame retardant without the use of halogenated additives.

SUMMARY OF INVENTION

The above discussed and other drawbacks and deficiencies of the prior art circuit materials are overcome or alleviated by a dielectric substrate comprising a liquid crystalline polymer, a particulate filler, and a fibrous web. Preferably, the particulate filler comprises silica. The dielectric material is economical to make, has a dielectric constant of less than about 3.8, a dissipation factor of loss than or equal to 0.007 when measured at frequencies of 1 to 10 GHz, excellent flame retardance, and low water absorption. The dielectric material also has improved dimensional stability.

In a preferred method of manufacture of the dielectric substrate, a film of the liquid crystalline polymer and a fibrous web are fed simultaneously through a set of two rollers at elevated temperature to integrate the film and the fibrous web. Optionally, second liquid crystalline polymer film and the integrated web may be fed simultaneously through a set of roller at an elevated temperature to integrate the second film with the fibrous web. The integrated film and web may also be fed through a set of rollers at an elevated temperature to impart dimensional stability to the integrated film and web. Preferably, particulate filler is dispersed in the film prior to integration with the fibrous web, to provide the above-described dielectric material.

In another embodiment, a dielectric substrate comprises a liquid crystalline polymer, a surface-treated particulate filler, and optionally a fibrous web. Use of a silane, zirconate, or other surface treatment results in significant improvement in the copper peel strength of the substrate, particularly at high temperatures.

Any of the foregoing dielectric materials may be disposed on a conductive layer to form a single clad circuit laminate and/or a resin coated conductive layer. An additional conductive layer may be disposed on the liquid crystalline polymer composite layer, on a side opposite to the first conductive layer, to form a diclad circuit laminate. Patterning at least one of the conductive layers provides a circuit. Additional layers may be added to make a multi-layer circuit. Use of the liquid crystalline polymer composites in circuit materials provides circuit and multi-layer circuits that have excellent flame retardance, dielectric properties, and physical properties.

The above discussed and other features and advantages of the present invention will be appreciated and understood by those skilled in the art from the following detailed description and drawings.

BRIEF DESCRIPTION OF DRAWINGS

Referring now to the exemplary drawings wherein like elements are numbered alike in the several FIGURES.

DETAILED DESCRIPTION

Figure 1:
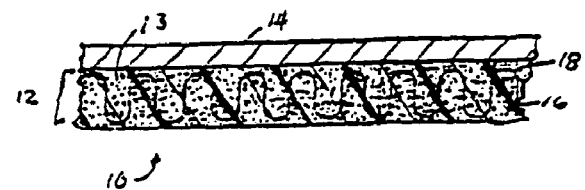
FIG. 1 is a schematic representation of an exemplary circuit material comprising the liquid crystalline polymer composite and a conductive layer.

A liquid crystalline polymer (LCP) composite useful as a dielectric material in circuits comprises a liquid crystalline polymer, a particulate filler, and a fibrous web. The liquid crystalline polymer composite exhibits low flammability without the use of halogenated flame retardants and has a dielectric constant (Dk) of less than about 3.8 and a dissipation factor less than or equal to about 0.007 when measured at a frequency of 1 to 10 Ghz. The liquid crystalline polymer composite is especially useful as a dielectric material for making rigid circuit materials, circuits, and multi-layer circuits for high frequency applications due to its combination of inherent flame retardance, excellent electrical properties, and low water absorption.

Liquid crystalline polymers are known polymers, and are sometimes described as "rigid-rod", "rod-like", or ordered polymers. These polymers are believed to have a fixed molecular shape, e.g. linear, or the like, due to the nature of the repeating units comprising the polymeric chain. The repeating units typically comprise rigid molecular elements. The rigid molecular elements (mesogens) are frequently rod-like or disk-like in shape and are typically aromatic and frequently heterocyclic. The rigid molecular elements may be present in either the main chain (backbone) of the polymer or in the side chains. When present in the main chain or in the side chains they may be separated by more flexible molecular elements, sometimes referred to as spacers.

Liquid crystalline polymers can be blended with polymers that are not liquid crystalline polymers, hereinafter referred to as non-liquid crystalline polymers. These blends are sometimes referred to as polymer alloys. Some of these blends have processing and functional characteristics similar to liquid crystalline polymers and are thus included within the scope of the present invention. The non-liquid crystalline polymers and liquid crystalline polymer components are generally mixed in a weight ratio of 10:90 to 90:10, preferably in the range of 30:70 to 70:30. Hereinafter the term liquid crystalline polymer will include liquid crystalline polymer blends.

Both thermotropic and lyotropic liquid crystalline polymers are useful. Furthermore, useful liquid crystalline polymers can be thermoplastic or thermosetting. Suitable thermotropic liquid crystalline polymers include liquid crystalline polyesters, liquid crystalline polycarbonates, liquid crystalline polyetheretherketones, liquid crystalline polyetherketoneketones, and liquid crystalline polyester imides, specific examples of which include (wholly) aromatic polyesters, polyester amides, polyamide imides, polyester carbonates, and polyazomethines.

Useful thermotropic liquid crystalline polymers also include polymers comprising a segment of a polymer capable of forming an anisotropic molten phase as part of one polymer chain thereof and a segment of a polymer incapable of forming an anisotropic molten phase as the rest of the polymer chain, and also a composite of a plurality of thermotropic liquid crystalline polymers.

Representative examples of the monomers usable for the formation of the thermotropic liquid crystalline polymers include: (a) at least one aromatic dicarboxylic acid compound, (b) at least one aromatic hydroxy carboxylic acid compound, (c) at least one aromatic diol compound, (d) at least one of an aromatic dithiol ($d_1$), an aromatic thiophenol ($d_2$), and an aromatic thiol carboxylic acid compound ($d_3$), and (e) at least one of an aromatic hydroxyamine compound and an aromatic diamine compound. The monomers may sometimes be used alone, but may frequently be used in a combination of monomers (a) and (c); (a) and (d); (a), (b) and (c); (a), (b) and (e); (a), (b), (c) and (e); or the like.

Examples of the aromatic dicarboxylic acid compound (a) include aromatic dicarboxylic acids such as terephthalic acid, 4,4'-diphenyldicarboxylic acid, 4,4'-triphenyldicarboxylic acid, 2,6-naphthalenedicarboxylic acid, 1,4-naphthalenedicarboxylic acid, 2,7-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and 1,6-naphthalenedicarboxylic acid; and alkyl-, alkoxy- and halogen-substituted derivatives of the above-mentioned aromatic dicarboxylic acids, such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Examples of the aromatic hydroxy carboxylic acid compound (b) include aromatic hydroxy carboxylic acids such as 4-hydroxybenzoic acid, 3-hydroxybenzoic acid, 6-hydroxy-2-naphthoic acid, and 6-hydroxy-1-naphthoic acid; and alkyl-, alkoxy- and halogen-substituted derivatives of the aromatic hydroxy carboxylic acids, such as 3-methyl-4-hydroxybenzoic acid, 3,5-dimethyl-4-hydroxybenzoic acid, 6-hydroxy-5-methyl-2-naphthoic acid, 6-hydroxy-5-methoxy-2-naphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Examples of the aromatic diol compound (c) include aromatic diols such as 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis(4-hydroxyphenoxy)ethane, 3,3'-dihydroxydiphenyl ether, 1,6-naphthalenediol, 2,2-bis(4-hydroxyphenyl) propane, and bis(4-hydroxyphenyl) methane; and alkyl-, alkoxy- and halogen-substituted derivatives of the aromatic diols, such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Examples of the aromatic dithiol ($d_1$) include benzene-1,4-dithiol, benzene-1,3-dithiol, 2,6-naphthalene-dithiol, and 2,7-naphthalene-dithiol. Examples of the aromatic thiophenol ($d_2$) include 4-mercaptophenol, 3-mercaptophenol, and 6-mercapto-phenol. Examples of the aromatic thiol carboxylic acid ($d_3$) include 4-mercaptobenzoic acid, 3-mercaptobenzoic acid, 6-mercapto-2-naphthoic acid, and 7-mercapto-2-naphthoic acid.

Examples of the aromatic hydroxyamine compound and the aromatic diamine compound (e) include 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl sulfide (thiodianiline), 4,4'-diaminodiphenyl sulfone, 2,5-diaminotoluene, 4,4'-ethylenedianiline, 4,4'-diaminodiphenoxyethane, 4,4'-diaminodiphenylmethane (methylenedianiline), and 4,4'-diaminodiphenyl ether (oxydianiline).

Thermotropic liquid crystalline polymers are prepared from monomer(s) as mentioned above by a variety of esterification methods such as melt acidolysis or slurry polymerization, or the like methods. The molecular weight of the thermotropic liquid crystalline polyester that may favorably be used may be about 2,000 to about 200,000, with about 4,000 to about 100,000 preferred. The measurement of the molecular weight may be done, for example, either through determination of the terminal groups of a compressed film thereof according to infrared spectroscopy, or by gel permeation chromatography (GPC).

Thermotropic liquid crystalline polymers may be used either alone or in mixture of at least two thereof. A preferred thermotropic liquid crystalline polymer is 2-naphthalene carboxylic acid, 6-(acetyloxy)- polymer with 4-(acetyloxy) benzoic acid.

Suitable lyotropic liquid crystalline polymers include concentrated sulfuric acid solutions of poly(p-phenylene terephthalamide) (PPTA), silk fibroin aqueous solutions, and sericin aqueous solutions. A PPTA liquid crystalline polymer is represented by Formula I:

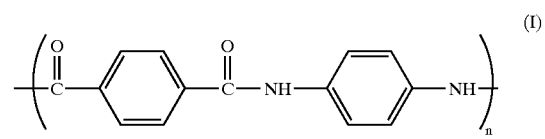

Possible liquid crystalline polymers which can be used include, but are not limited to VECTRA®, commercially available from Ticona, XYDAR®, commercially available from Amoco Polymers, and ZENITE®, commercially available from DuPont, among others. The liquid crystalline polymers and polymer blends described hereinabove are meant for illustration and not for limitation, as many other suitable liquid crystalline polymers and polymer blends are known in the art. Likewise, compatibilizers, plasticizers, flame retardant agents, and other additives may be contained in the liquid crystalline polymers. It is further contemplated that dielectric materials other than those disclosed herein may be used in combination with at least one liquid crystalline polymer layer in the formation of circuit materials, circuits and multi-layer circuits.

Useful amounts of liquid crystalline polymer are less than or equal to about 80 weight percent (wt %), preferably less than or equal to about 60 wt %, and more preferably less than or equal to about 50 wt %, based on the total weight of the liquid crystalline polymer composite. Alternatively, the amount of liquid crystalline polymer is greater than or equal to about 20 wt %, preferably greater than or equal to about 30 wt %, and more preferably greater than or equal to about 40 wt %, based on the total weight of the liquid crystalline polymer composite.

Useful particulate fillers include, but are not limited to, titanium dioxide (rutile and anatase), barium titanate, strontium titanate, silica (particles and hollow spheres), including fused amorphous silica and fumed silica, corundum, wollastonite, aramide fibers (e.g., KEVLAR from DuPont), fiberglass, $Ba_2Ti_9O_{20}$, glass spheres, quartz, boron nitride, aluminum nitride, silicon carbide, beryllia, alumina, and magnesia. The particulate fillers may be used alone or in combination. Particularly preferred particulate fillers are rutile titanium dioxide and amorphous silica because these fillers have a high and low dielectric constant, respectively, thereby permitting a broad range of dielectric constants combined with a low dissipation factor to be achieved in the final product by adjusting the respective amounts of the two fillers in the composition.

It has been unexpectedly found by the inventors hereof that use of silica and/or organic fillers in particular improve the z-axis CTE of extruded liquid crystalline polymer films. Liquid crystalline polymer films tend to significantly orient during extrusion. Balanced films are currently obtained by use of one or more counter-rotating dies, optionally in combination with blowing, which greatly increase time and cost of manufacture. Use of fillers to provide balanced films therefore represents a significant advantage in manufacture. A range of particle sizes may be used depending on the desired dielectric constant, the presence of other fillers, and like considerations. Suitable average particle sizes may therefore be from 1 nanometer to 10 micrometers. Combinations of particle sizes may also be used, for example particles having an average particle size of 1–10 nanometers, together with particles having an average particle size of 1–5 micrometers. In one embodiment, coarse silica, i.e., silica having an average particle size of 0.5–5, 1–7, or 3–10 microns is used. Fine particle size silica may also be used, i.e., silica having an average particle size from 0.01–0.1 or 0.1–0.5 micrometers. Silica and/or polytetrafluoroethylene fillers are preferred.

To improve adhesion between the fillers and liquid crystalline polymer, coupling agents, e.g., silanes may be used. It has been unexpectedly found that use of coupling agents significantly improves the copper peel strength of the dielectric substrate, particularly at high temperature. This is of importance in "reworking", that is, removal and replacement of defective soldered components and devices. Poor copper peel strength at elevated temperatures can result in a damaged circuit board during rework, resulting in waste.

Useful coupling agents include those capable of adhering to both the surface of the filler and the liquid crystalline polymer. Examples include various compounds comprising chromium, silicon, titanium, or zirconium, and mixtures comprising at least one of the foregoing compounds. A useful chromium-containing adhesion promoter is described, for example, in U.S. Pat. No. 5,904,797 to Kwei, which discloses using chromium (III) methacrylate/polyvinyl alcohol solutions to improve bonding between thermoset resins and hydrophilic surfaces.

Useful compounds comprising titanium include, but are not limited to, monoalkoxy titanates such as tetra-n-butoxy titanium, isopropyl tri(N-ethylaminoethylamino) titanate, isopropyl tri-isostearoyl titanate and titanium di(dioctylpyrophosphate) oxyacetate; coordinate titanates such as tetraisopropyl di(dioctylphosphito)titanate; and neoalkoxy titanates such as neoalkoxy tris(dodecanoyl) benzenes sulfonyl zirconate, neoalkoxy tri(p-N-(beta-aminoethyl) aminophenyl)titanate. Other types include chelate, quaternary, and cycloheteroatom titanates.

Useful compounds comprising zirconium include, but are not limited to, neoalkoxy zirconates such as neoalkoxy trisneodecanoyl zirconate, neoalkoxy tris(dodecanoyl) benzene sulfonyl zirconate, neoalkoxy tris(m-aminophenyl) zirconate, ammonium zirconium carbonate and zirconium propionate.

Useful compounds comprising silicon include a wide variety of silanes. One type of useful silane is represented by the formula $$R_{4-n}SiK_n \quad (I)$$

wherein R is an alkyl or aryl group, or a functional group represented by the formula $$C_xH_{2x}Y \quad (II)$$

wherein x is from 0 to 20 and Y is selected from the group consisting of amino, amido, hydroxy, alkoxy, halo, mercapto, carboxy, acyl, vinyl, allyl, styryl, epoxy, isocyanato, glycidoxy, and acryloxy groups. K is a hydrolyzable group, such as alkoxy (e.g., methoxy, ethoxy, and the like), phenoxy, acetoxy, and the like, or halogen (e.g., chlorine); and n is 1, 2, 3, or 4, and preferably n is 3. The adhesion promoters represented by formula (I) include halosilanes, aminoalkoxysilanes, aminophenylsilanes, phenylsilanes, heterocyclic silanes, N-heterocyclic silanes, acrylic silanes, and mercapto silanes. Mixtures of two or more silanes also are useful. In one embodiment K is OR wherein R is an alkyl group containing up to about 5 carbon atoms or an aryl group containing up to about 8 carbon atoms. In other embodiments x is an integer from 0 to 10 and more often from 1 to about 5.

The adhesion promoter can be an epoxy silane represented by the formula

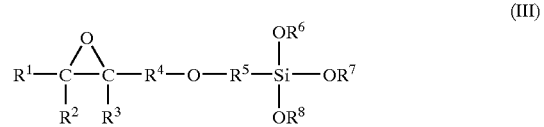

wherein: $R^1$, $R^2$ and $R^3$ are independently hydrogen or hydrocarbon groups; $R^4$ and $R^5$ are independently alkylene or alkylidene groups; and $R^6$, $R^7$ and $R^8$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl. The alkylene or alkylidene groups $R^4$ and $R^5$ preferably contain from 1 to about 10 carbon atoms, more preferably 1 to about 6 carbon atoms, more preferably 1 to about 4 carbon atoms, more preferably 1 or 2 carbon atoms. The alkylene and alkylidene groups can be methylene, ethylene, propylene, and the like.

The adhesion promoter can also be an acrylic silane represented by the formula

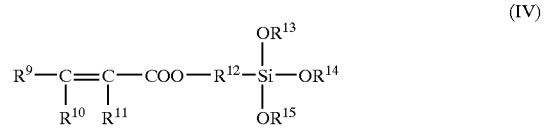

wherein: $R^9$, $R^{10}$ and $R^{11}$ are independently hydrogen or hydrocarbon groups; $R^{12}$ is an alkylene or alkylidene group; and $R^{13}$, $R^{14}$ and $R^{15}$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, and the like). The alkylene and alkylidene groups preferably contain from 1 to about 10 carbon atoms, more preferably 1 to about 6 carbon atoms, more preferably 1 to about 4 carbon atoms. The alkylene groups include methylene, ethylene, propylene, and the like The adhesion promoter additionally can be an amino silane represented by the formula

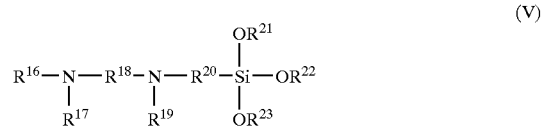

wherein: $R^{16}$, $R^{17}$ and $R^{19}$ are independently hydrogen or hydrocarbon groups; $R^{18}$ and $R^{20}$ are independently alkylene or alkylidene groups; $R^{21}$, $R^{22}$ and $R^{23}$ are independently hydrocarbon groups; and n is 0 or 1. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, and the like). The alkylene and alkylidene groups preferably contain from 1 to about 10 carbon atoms, more preferably 1 to about 6 carbon atoms, more preferably 1 to about 4 carbon atoms. The alkylene groups include methylene, ethylene, propylene, and the like.

Mercapto silane adhesion promoters can be represented by the formula

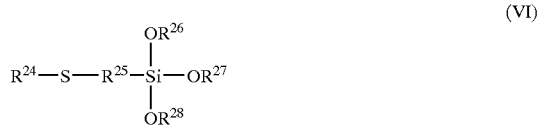

wherein $R^{24}$ is hydrogen or a hydrocarbon group; $R^{25}$ is an alkylene or alkylidene group; and $R^{26}$, $R^{27}$ and $R^{28}$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, and the like). The alkylene and alkylidene groups preferably contain from 1 to about 10 carbon atoms, more preferably 1 to about 6 carbon atoms, more preferably 1 to about 4 carbon atoms. These groups are preferably alkylene (e.g., methylene, ethylene, propylene, and the like).

Vinyl adhesion promoter can be represented by the formula

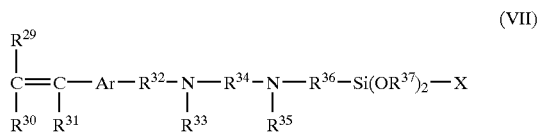

wherein: $R^{29}$, $R^{30}$, $R^{31}$, $R^{33}$ and $R^{37}$ are independently hydrogen or hydrocarbon groups; $R^{32}$, $R^{34}$ and $R^{36}$ are independently alkylene or alkylidene groups; each $R^{37}$ is independently a hydrocarbon group; Ar is an aromatic group; and X is a halogen. The hydrocarbon groups preferably contain 1 to about 10 carbon atoms, more preferably 1 to about 6 carbon atoms, more preferably 1 to about 4 carbon atoms. The hydrocarbon groups are preferably alkyl (e.g., methyl, ethyl, propyl, and the like). The alkylene and alkylidene groups preferably contain from 1 to about 10 carbon atoms, more preferably 1 to about 6 carbon atoms, more preferably 1 to about 4 carbon atoms. These groups are preferably alkylene (e.g., methylene, ethylene, propylene, and the like). The aromatic group Ar can be mononuclear (e.g., phenylene) or polynuclear (e.g., naphthylene) with the mononuclear groups and especially phenylene being preferred. The halogen, X, is preferably chlorine or bromine, more preferably chlorine.

Finally, the adhesion promoter can be a bis-silane represented by the formula

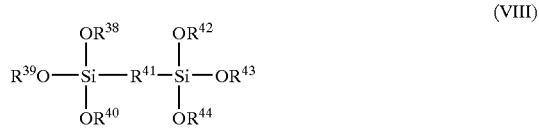

wherein $R^{38}$, $R^{39}$, $R^{40}$, $R^{42}$, $R^{43}$ and $R^{44}$ are independently hydrocarbon groups; $R^{41}$ is an alkylene or alkylidene group; and n is 0 or 1. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, and the like). The alkylene and alkylidene group preferably contains from 1 to about 10 carbon atoms, more preferably 1 to about 6 carbon atoms, more preferably 1 to about 4 carbon atoms. $R^{41}$ group is preferably alkylene (e.g., methylene, ethylene, propylene, and the like).

Other useful silanes include polymeric types, such as trimethoxy-, triacetoxy-, or triethoxysilyl modified poly-1, 2-butadiene, or aminoalkyl silsequioxanes wherein the alkyl group has two to about 10 carbon, for example gamma-aminopropylsilsesquioxane, available under the trade name Silquest A-1106 from OSi Specialties, Inc.

The coupling agents may be used singly or in combination. A preferred coupling agent is Silquest A-1170 or Silquest A-174. In practice, the coupling agents (in an optional solvent) are applied to the filler(s) before combination with the liquid crystalline polymer, although a mixture of liquid crystalline polymer and filler may be treated with the coupling agent. The choice of coating method is not critical and generally depends on the scale of the preparation. The amount of coupling agent applied to the filler depends on the type of agent, the type of filler, the type of liquid crystalline polymer, and like considerations. In general, the coupling agent is applied to the filler so as to result in an amount of about 0.001 to about 10 weight percent of the weight of the filler, preferably about 0.01 to about 1.0 weight percent.

Particulate filler is typically present in an amount that is less than or equal to about 70 wt %, preferably less than or equal to about 60 wt %, and more preferably less than or equal to about 50 wt %, based on the total weight of the liquid crystalline polymer composite. Alternatively, the amount of particulate filler is greater than or equal to about 10 wt %, preferably greater than or equal to about 20 wt %, and more preferably greater than or equal to about 30 wt %, based on the total weight of the liquid crystalline polymer composite.

Coupling agents may be used to promote the formation of or participate in covalent bonds connecting the filler surface with a polymer. Exemplary coupling agents include 3-mercaptopropylmethyldimethoxysilane and 3-mercaptopropyltrimethoxysilane. Coupling agents, when used, may be added in the amounts of about 0.1 wt % to about 1 wt % of the total weight of the resin composition.

The fibrous web is herein defined as a woven or non-woven assemblage of fibers capable of withstanding the processing conditions involved in the formation of the liquid crystalline polymer composite, circuit board materials, and circuits formed therefrom. The fibrous web comprises thermally stable webs of a suitable fiber, preferably glass (E, S, and D glass) or high temperature polymer fibers (e.g., KODEL polyester from Eastman Kodak) or polyphenylene sulfide fiber from Phillips Petroleum. Such thermally stable fiber reinforcement provides the composite with the desired structural rigidity. In addition, the use of the fibrous web renders a liquid crystalline polymer composite with a relatively high mechanical strength.

Preferred examples of the fibrous web are set forth in the following Table:

TABLE 1

| Manufacturer | Style | Thickness (inches) |
| --- | --- | --- |
| Fiber Glast | 519-A | 0.0015 |
| Hexcel-Schwebel | 1674 | 0.0045 |
| Hexcel-Schwebel | 1080 | 0.0025 |
| BGF | 106 | 0.0015 |
| BGF | 7628 | 0.0069 |

Generally, the fibrous web is present in an amount that is less than or equal to about 50 wt %, preferably less than or equal to about 40 wt %, and more preferably less than or equal to about 30 wt %, based on the total weight of the liquid crystalline polymer composite. Alternatively, the amount of fibrous web is greater than or equal to about 10 wt %, preferably greater than or equal to about 15 wt %, and more preferably greater than or equal to about 20 wt %, based on the total weight of the liquid crystalline polymer composite. In general, the fibrous web has a thickness of about 1 to about 180 micrometers. Within this range, a thickness of greater than about 25 micrometers is preferred, with greater than about 40 micrometers more preferred, and greater than about 60 micrometers particularly preferred. Also within this range, a thickness of less than about 150 micrometers is preferred, with less than about 125 micrometers more preferred, and less than about 100 micrometers particularly preferred. The thickness of the liquid crystalline polymer composite is preferably about 1 to about 180 mils (about 0.025 to about 3.05 millimeters).

In general, the liquid crystalline polymer composite is processed as follows. First, the liquid crystalline polymer, particulate fillers, and any optional components, e.g., coupling agents, silanes, or the like, are thoroughly mixed to form an intimate blend in conventional mixing equipment, preferably in melt. The mixing temperature is regulated to avoid substantial decomposition, crosslinking, or other reaction of the components. Mixing continues until the particulate filler is uniformly dispersed throughout the liquid crystalline polymer. The particulate filler may be pretreated with coupling agents (preferably silanes) in a separate step for more efficient use of the agents. The blend can then be formed into a film or sheet by methods known in the art, for example extrusion or casting. The liquid crystalline polymer/particulate filler film is then combined with the fibrous web, e.g., a glass cloth, to form the liquid crystalline polymer composite. The methods of combining the glass cloth and the liquid crystalline polymer/particulate filler are various and include, but are not limited to, co-extrusion, lamination, and powder coating followed by heating to an elevated temperature under pressure, to allow the liquid crystalline polymer to flow into the interfiber spaces of the glass cloth.

In a preferred method for forming the dielectric material, a liquid crystalline polymer film and a fibrous web are contacted at a temperature within about 10° C. of the melting point of the liquid crystalline polymer, preferably under pressure, so as to form an integrated dielectric material. Known methods may be used to form a suitable liquid crystalline polymer film, for example extrusion, casting, thermal spraying, powder coating, or the like. Extrusion is preferred, wherein liquid crystalline polymer pellets, for example, are melted and blended in an extruder. Fillers and optional additives may be present in the pellets, or mixed with the liquid crystalline polymer in the extruder.

Extrusion conditions may be readily determined by one of ordinary skill in the art depending on the nature of the liquid crystalline polymer, the filler, optional additives, and like considerations. Preferably, temperature and pressure are regulated so as to avoid substantial decomposition or crosslinking of the components. Suitable extrusion conditions for liquid crystalline polymers are generally about 200° C. to about 400° C. Within this range, a temperature of greater than about 220° C. is preferred, with greater than about 240° C. more preferred, and greater than about 280° C. especially preferred. Also within this range, a temperature of less than about 380° C. is preferred, with less than about 360° C. more preferred, and less than about 340° C. especially preferred.

The liquid crystalline polymer film is typically formed having a thickness of about 25 micrometers to about 200 micrometers. Within this range, a thickness of greater than about 30 micrometers is preferred, with about 40 micrometers more preferred, and about 50 micrometers especially preferred. Also within this range, a thickness of less than about 150 micrometers is preferred, with less than about 125 micrometers more preferred, and less than about 100 micrometers especially preferred.

The liquid crystalline polymer layer is contacted with the fibrous web to form a liquid crystalline polymer/fibrous web composite. As used herein and throughout, "disposed," "contacted," and variants thereof refers to the complete or partial physical contact between the respective materials, substrates, layers, films, and the like. Preferably, the film is extruded onto the fibrous web and then integrated with the fibrous web at a temperature within about 10° C. of the melting temperature of the liquid crystalline polymer.

For example, the fibrous web may be fed as a substrate in a conveyor-like fashion and the liquid crystalline polymer layer may be disposed (or extruded) onto an exposed surface of the fibrous web. The fibrous web may be at room temperature, or it may be pre-heated to a temperature of about 200° C. to about 350° C. Within this range, a temperature of greater than about 220° C. is preferred, with greater than about 250° C. more preferred. Also within this range, a temperature of less than about 320° C. is preferred, with less than about 280° C. more preferred. Pre-heating of the fibrous web is useful where the contact time between the fibrous web and the liquid crystalline polymer layer is insufficient to heat the fabric to the melting temperature of the liquid crystalline polymer layer.

Under some circumstances extrusion of a sufficiently flowable liquid crystalline polymer composition onto the fibrous web will result in an integrated polymer/web dielectric material. However, it is usually preferred to pass the polymer layer and web between a set of rollers at an elevated temperature, wherein a first roller is in physical contact with at least the fibrous web, and a second roller is in physical contact with the liquid crystalline polymer layer. This integrates and adheres the liquid crystalline polymer layer with the fibrous web to form a liquid crystalline polymer composite. At least one of the rollers is preferably heated to within 10° C. of the melting point of the liquid crystalline polymer, which will generally be about 200° C. to about 350° C., with about 220° C. to about 320° C. more preferred. The other roller may also be heated, or maintained at room temperature.

It is further contemplated that additional layers may be present during the integration of the liquid crystalline polymer layer/fibrous web. For example, a first liquid crystalline polymer layer may be integrated on a first side of the fibrous web, and a second liquid crystalline polymer layer may be subsequently integrated on a second side of the fibrous web. Additional liquid crystalline polymer layers, or other dielectric layers, may be present.

After integration, the dimensional stability of the polymer/web composite is adjusted, preferably by heat treatment. In an exemplary method, the integrated polymer/web composite is fed through a set (or multiple sets) of rollers at a temperature and pressure effective to adjust the dimensional stability of the composite. The number of sets is 1 to about 6, with 2 to about 5 preferred, and 3 to 4 more preferred. The subsequent set or sets are generally held at a temperature equal to or lower than the first set rollers, for example at about 150° C. to about 320° C. Within this range, a temperature of greater than about 175° C. is preferred, with greater than about 200° C. more preferred, and greater than about 220° C. especially preferred. Also within this range, a temperature of less than about 300° C. is preferred, with less than about 280° C. more preferred, and less than about 260° C. especially preferred.

As previously stated, the liquid crystalline polymer composite disclosed herein is useful as a dielectric material for circuit materials, such as laminates, bond plies, and resin coated conductive layers, all or some of which may be used to form circuits and multi-layer circuits. The liquid crystalline polymer composite is particularly useful as a dielectric substrate in circuit laminates.

Useful conductive layers for the formation of circuit laminates include stainless steel, copper, aluminum, zinc, iron, transition metals, and alloys comprising at least one of the foregoing, with copper preferred. There are no particular limitations regarding the thickness of the conductive layer, nor are there any limitations as to the shape, size or texture of the surface of the conductive layer. Preferably however, the conductive layer comprises a thickness of about 3 micrometers to about 200 micrometers with about 9 micrometers to about 180 micrometers especially preferred. When two or more conductive layers are present, the thickness of the two layers may be the same or different.

Copper conductive layers are preferred. The copper conductive layer can be treated to increase surface area, treated with a stabilizer to prevent oxidation of the conductive layer (i.e., stainproofing), or treated to form a thermal barrier. Both low and high roughness copper conductive layers treated with zinc or zinc alloy thermal barriers are particularly useful, and may further optionally comprise a stainproofing layer. Such copper conductive layers are available from, for examples, Yates Foil, USA under the trade names "TWX" and "TW," Oak-Mitsui under the tradename "TOB," Circuit Foil Luxembourg under the tradename "TWS," and Gould Electronics under the tradename "JTCS." Other suitable copper conductive layers are available from Yates Foil under the trade name "TAX;" from Circuit Foil Luxembourg under the trade name "NT TOR;" from Co-Tech Copper Foil Company under the trade name "TAX;" and from Chang Chun Petrochemical Company under the trade name "PINK."

Circuit laminates may be formed using a batch wise or semi-continuous process, wherein at least one layer of the liquid crystalline polymer composite, and any desired optional additional layers used to form the circuit or multi-layer circuit are arranged in a desired order to form a stack. The stack is then placed in a press, which may or may not be evacuated to form a vacuum. The temperature is typically increased at a rate of about 2 to about 10° C./minute. Once the temperature reaches the desired lamination temperature the pressure is increased to about 2 to about 3 MegaPascal (MPa). While the desired temperature depends upon the composition of the dielectric material, the temperature is typically about 200° C. to about 350° C. The stack is held at the desired temperature and pressure for a time sufficient to adhere the layers, about 5 to about 45 minutes. The resulting article is then cooled while maintaining the desired pressure. The article may be removed from the press when the temperature is about 100° C. or lower, and stored until used.

A first exemplary embodiment of a circuit material in accordance with the present invention is shown in FIG. 1, wherein a circuit material 10 comprises conductive layer 14 disposed on a dielectric material 12. Dielectric material 12 comprises a liquid crystalline polymer 13, a particulate filler 16, and a woven web 18. Alternatively, woven web 18 may be substituted for a non-woven assemblage (not shown). A single clad circuit laminate is provided when dielectric material 12 is substantially non-flowable, (i.e. a dielectric substrate) and a resin coated conductive layer is provided when dielectric material 12 is flowable during circuit manufacture, e.g., during lamination. Additionally, conductive layer 14 may be in the form of a circuit layer (not shown) to form a single clad circuit (not shown).

Figure 2:
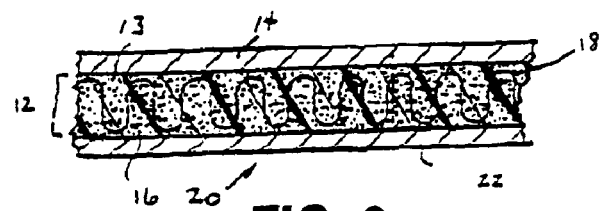
FIG. 2 is a schematic representation of a diclad circuit laminate comprising the liquid crystalline polymer composite.

A second exemplary embodiment is shown in FIG. 2, wherein a diclad circuit laminate 20 comprises a dielectric substrate 24 disposed between two conductive layers 14, 22. Dielectric substrate 24 comprises liquid crystalline polymer 13, particulate filler 16, and woven web 18. Alternatively, woven web 18 may be substituted for a non-woven assemblage (not shown). Additionally, one or both conductive layers 14, 22 may be in the form of a circuit (not shown) to form a diclad circuit (not shown).

Figure 3:
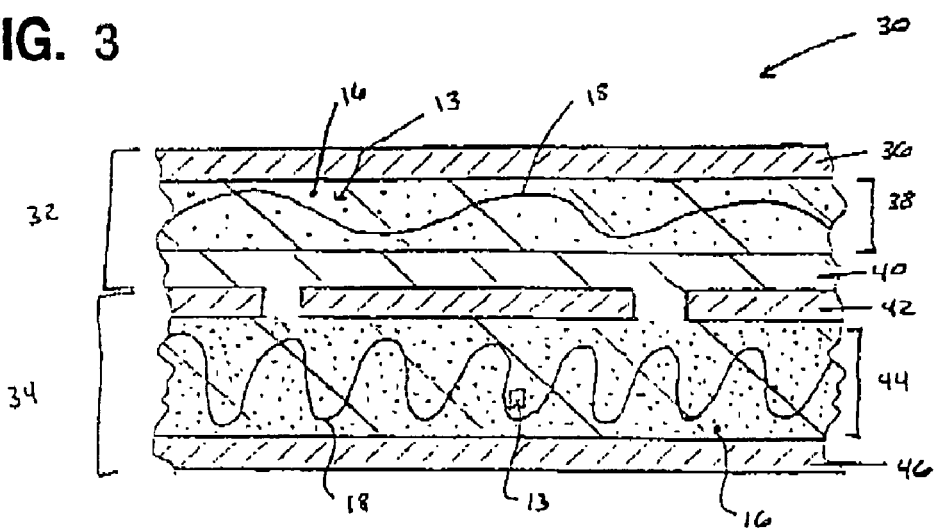
FIG. 3 is a schematic representation of one exemplary multi-layer circuit.

A third exemplary embodiment is shown in FIG. 3. FIG. 3 depicts a multi-layer circuit 30 comprising a resin coated conductive layer 32 disposed on a diclad circuit 34. Resin coated conductive layer 32 comprises a substantially non-flowable dielectric material 38 disposed between a conductive layer 36 and a flowable dielectric material 40. Diclad circuit 34 comprises a dielectric substrate 44 disposed between a circuit layer 42 and a conductive layer 46. Dielectric substrate 44 includes liquid crystalline polymer 13, particulate filler 16, and woven web 18. Flowable dielectric material 40 is disposed on a side of circuit layer 42 opposite to dielectric substrate 44. Flowable dielectric material 40 comprises a dielectric material that does not contain any additives that would hinder flow. Additionally, substantially non-flowable dielectric material 38 comprises particulate filler 16 and woven web 18 in amounts that may be less than, equal to (not shown), or greater than (not shown) the amounts used in dielectric substrate 44. Alternatively, woven web 18 may be substituted for a non-woven assemblage (not shown).

Figure 4:
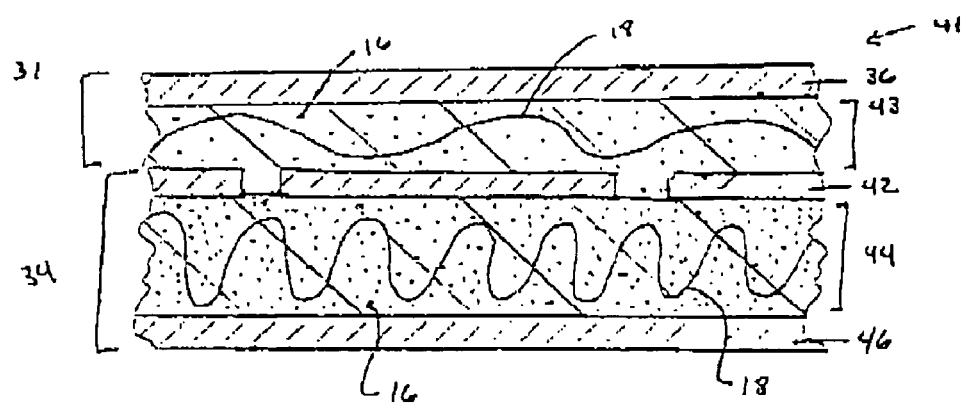
FIG. 4 is a schematic representation of another exemplary multi-layer circuit.

FIG. 4 depicts a multi-layer circuit 41 comprising an alternative embodiment of a resin coated conductive layer. Here, a resin coated conductive layer 31 comprises conductive layer 36 disposed on a flowable dielectric material 43. Flowable dielectric material 43 is disposed on circuit layer 42 of diclad circuit 34 on a side of circuit layer 42 opposite to dielectric substrate 44. In this embodiment, flowable dielectric material 43 comprises less, including no (not shown), particulate filler 16 and/or woven web 18 (or non-woven assemblage (not shown)) and/or liquid crystalline polymer composite 13, as does dielectric substrate 44.

Figure 5:
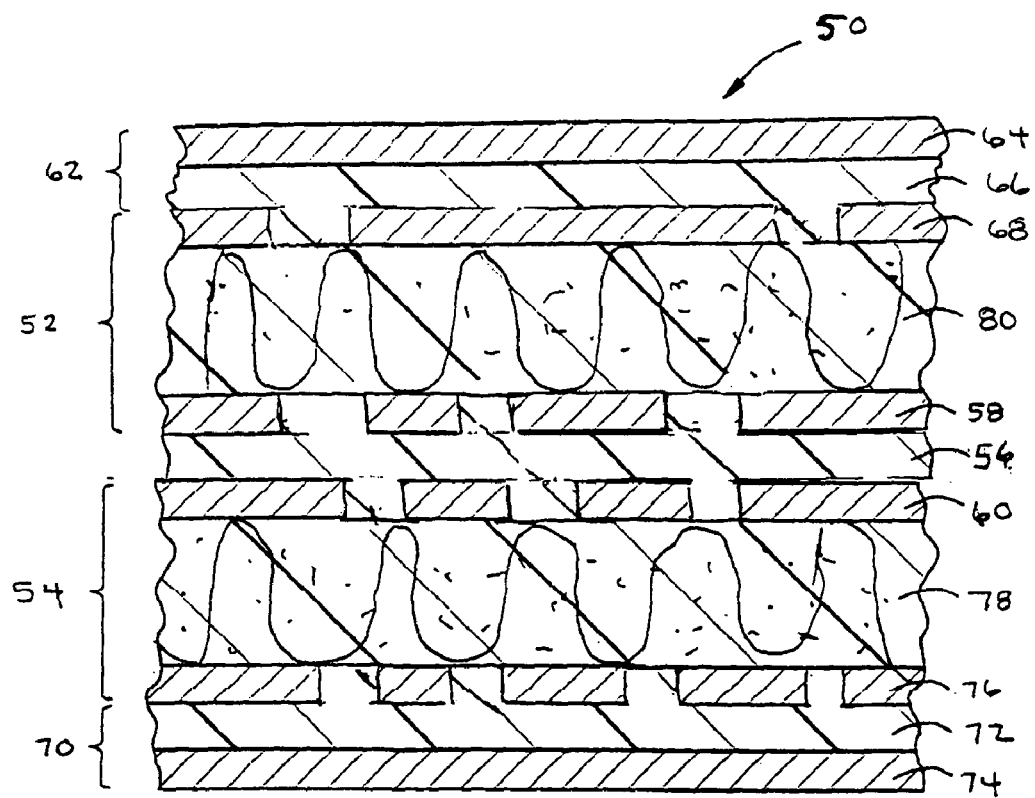
FIG. 5 is a schematic representation of still another exemplary multi-layer circuit.

FIG. 5 depicts another exemplary embodiment of a multi-layer circuit 50 comprising diclad circuits 52, 54. A bond ply 56 is disposed between circuit layers 58, 60. Additionally, a resin coated conductive layer 62 comprising a conductive layer 64 disposed on a flowable dielectric material 66, is disposed on a circuit layer 68 of circuit 52. An additional resin coated conductive layer 70, comprising a flowable dielectric material 72 and a conductive layer 74 is disposed on a circuit layer 76. Additionally a substantially non-flowable dielectric material (not shown) may be disposed between conductive layer 64 and flowable dielectric material 66 and/or between conductive layer 74 and flowable dielectric material 72. A Dielectric substrate 78, 80 comprises a liquid crystalline polymer 13, a particulate filler 16, and a woven web 18 (or non-woven assemblage (not shown)). Alternatively, one or more of the other dielectric materials may comprise the liquid crystalline polymer composite of the present disclosure. As may be seen from the above descriptions, it is contemplated that dielectric materials comprising materials other than those disclosed herein may be used in combination with the dielectric materials disclosed herein to form circuit materials, circuits and multilayer circuits.

The circuit materials, circuits, and multi-layered circuits manufactured using the liquid crystalline polymer composite described herein as a dielectric material have a Dk below about 3.8 and a Df of less than about 0.007 when measured at a frequency of 1 to 10 GHz. They also have good flame retardance, i.e., a rating of V-1 or better as determined by Underwriter's Laboratory procedure UL-94. They further have good dimensional stability and structural rigidity. The water absorption is less than 0.1% at a humidity of 50%, preferably at 90%. Copper bond strength at 200° C. is preferably greater than about 1, more preferably greater than about 1.2 at 200° C. in both the machine and cross machine directions. CTE in the machine direction is preferably greater than about −5 ppm, more preferably greater than about 1 ppm, most preferably greater than about 5 ppm, while CTE in the cross machine direction is preferably less than about 70 ppm, more preferably less than about 60 ppm, most preferably less than about 50 ppm. The films furthermore have a good balance of tensile strength, modulus, and elongation in both the machine and cross machine directions. Preferably the ratio of tensile strength in the machine direction to cross machine direction is less than about 5, more preferably less than about 4, most preferably less than about 3. Preferably the ratio of modulus in the machine direction to cross machine direction is less than about 5, more preferably less than about 4, most preferably less than about 3.

The invention is further demonstrated by the following examples, which are meant to be illustrative, not limiting.

Example 1

In these examples, a liquid crystalline polymer such as Vectra A, available from Ticona, was processed as described above using varying amount of silica (0–40%). During the assembly process, the layers of glass are placed so that they are evenly sandwiched between the layers of liquid crystalline polymer, e.g., the liquid crystalline polymer is against the Cu foil (½-ounce copper such as NT-TOR from Circuit Foil). The glass typically selected for this application is that of 1080 type from Hexcel Schwebel. The silica used is a 10-micrometer fused silica typically available from MINCO or CE Minerals. The laminates are processed by applying heat up to 564° F. at a rate of 5° F./min while under 250 pounds per square inch (psi) pressure. Once the press reaches 564° F., the pressure is increased to 400 psi and the condition is maintained for 15 min. When the dwell is complete, the press is cooled to 200° F. at a rate of 5° F./min while maintaining 400 psi. Three compositions were made: one comprising 9.5 wt % silica, 53.5% wt liquid crystalline polymer and 37% glass cloth; a composition comprising 31% wt silica, 47 wt % liquid crystalline polymer and 22 wt % glass cloth; and a control composition comprising 0 wt % silica, 61 wt % liquid crystalline polymer and 39% glass cloth.

TABLE 2

| Property | | 31% silica 22% glass cloth 47% LCP | 9.5% silica 37% glass cloth 53.5% LCP | 61% LCP 39% glass cloth* |
|---|---|---|---|---|
| Dk (3 GHz) | | 3.39 | 3.58 | 3.4500 |
| Df (3 GHz) | | 0.0028 | 0.0033 | 0.0038 |
| Specific Gravity | | 1.75 | 1.73 | 1.7000 |
| Void Content | | 0.8 | 0.6 | 0.6 |
| Solid Content, % | | 51.1 | 44.1 | 38.3 |
| Z-axis CTE, ppm, 30–150° C. | | 54 | 90 | about 125 |
| Dielectric Breakdown Strength, V/mil | Average. | 1537 | 1492 | 1600 |
| | Std. Dev. | 45 | 151 | 168 |
| Flame Test Seconds | Ave. T1 | 4.1 | 5.62[1] | 19.7[2] |
| | Ave. T2 | 0 | 0 | 2.8 |
| | Sum (T1 + T2) | 20.5 | 28.2 | 1103 |
| Bond strength, pli | | 6 | | 6.0 |

[1]One sample above 10 seconds
[2]All samples above 10 seconds
*Control

As shown by the above data, the best combination of electrical properties and coefficient of thermal expansion (CTE) are obtained using a combination of silica filler and glass cloth in the liquid crystalline polymer.

Example 2

A sample of fused amorphous silica designated, BSI LT-30 by its manufacturer, Brookes, Services, Inc., was treated with A-187 epoxy functional silane from OSI. Three kilograms of the fused silica were placed in an 8-quart capacity Vee blender. 30 grams of A-187 silane were dissolved in a mixture of 25 grams of methylene chloride, 20 grams of Dowanol-PM, and 8 grams of distilled water. The silane solution was added to the powder through the liquid addition bar of the Vee blender over a period of five minutes. The treated filler was spread into an over pan and baked for 16 hours at 125° C. to cure the silane onto the silica surface.

The cured silica was then compounded at a level of 26 volume % filler in a sample of Vectra A950 LCP polymer in a twin-screw extruder and the extruded into film 0.004 inches thick.

A copper clad circuit substrate was made by layering the films with 1080 woven glass fabric and laminating it between two sheets of NTTOR type copper foil (purchased from Circuit Foil Luxembourg). The 0.020-inch thick laminate contained eight layers of the 0.002-inch LCP film and four layers of the 1080 glass fabric.

The peel strength was measured using a 90°-peel tester on ⅛ inch wide copper foil strips in the machine direction (MD) and across the machine direction (CMD). The test samples were immersed in 200° C. hot oil during the peel test.

TABLE 3

| Sample | 200° C. copper bond strength (pli) | | Dk | Df |
| --- | --- | --- | --- | --- |
| | MD | CMD | | |
| Control - untreated silica | 0.64 | 0.56 | 3.42 | 0.0026 |
| Silane treated silica | 1.5 | 1.4 | 3.34 | 0.0029 |
| Control - unfilled liquid crystalline polymer film | 0.64 | 0.84 | 3.12 | 0.0033 |
| Control - polybutadiene substrate | 1.3 | — | — | — |

As shown in Table 3 above, the control sample exhibited peel strength at 200° C. of about 0.6 pounds per linear inch (pli). A flexible circuit substrate based on a commercially-available unfilled liquid crystalline polymer film exhibited a peel strength of 0.6 to 0.8 pli. The circuit substrate made with the silane treated silica filler exhibited more than double the peel strength of the control, with values of 1.4 to 1.5 pli. This is greater than that of another rigid substrate comprising polybutadiene that is in widespread commercial use.

Example 3

In these examples, liquid crystalline polymer films containing silica filler in accordance with the invention were prepared by compounding VECTRA 950A from Ticona with the indicated amounts of silica. Pellets of the compounded composite were then extruded to form a film and the tensile strength, modulus, and percent elongation were determined. The resulting material was then tested for coefficient of thermal expansion (CTE) according to test method ASTM D-696, and for tensile strength, tensile modulus, and percent elongation according to test method IPC-TM-650, method 2.4.19. These results were compared with VECTRA 950A from Ticona with no silica, and with a liquid crystalline polymer film from Kuraray with no silica. Results are shown in Table 4 below:

CTE data for films made as above using A950 and C950 with varying amounts of silica are shown in Table 5 below.

TABLE 5

| Sample | % silica | Type of silica | CTE - MD (ppm) | CTE - CMD (ppm) |
| --- | --- | --- | --- | --- |
| Vectra A 950* | 0 | — | -13 | 78.3 |
| A950 - 15 | 15 | Fine | -7 | 73.2 |
| A950 - 40F | 40 | Fine | 6.4 | 54.1 |
| A950 - 40C | 40 | Coarse | 4.3 | 53.6 |
| A950 - 50C | 50 | Coarse | 9.9 | 48.1 |
| C950* | 0 | — | -10.6 | 94.7 |
| C950 - 50C | 50 | Coarse | 11.3 | 47.8 |

*Control

While preferred embodiments have been shown and described, various modifications and substitutions may be made thereto without departing from the spirit and scope of the invention. Accordingly, it is to be understood that the present invention has been described by way of illustration and not limitation. Specific embodiments accordingly include, but are not limited to, the following:

What is claimed is:

1. A circuit material comprising a layer of a dielectric liquid crystalline composite, the composite comprising
    a liquid crystalline polymer;
    a particulate filler composition comprising a combination of silica and polytetrafluoroethylene; and
    a fibrous web, wherein the composite has a dielectric constant of less than about 3.8 at frequencies higher than or equal to 1 GHz, a dissipation factor of less than or equal to about 0.007, and a UL-94 rating of V-1 or better.

2. The circuit material of claim 1 further comprising a copper conductive layer, wherein the the bond strength between the conductive layer and liquid crystalline composite layer is greater than or equal to about 1 pli at 200° C.

3. The circuit material of claim 1, wherein the silica is treated with a coupling agent.

TABLE 4

| Sample | Tensile strength | | | | Modulus | | | | | Elongation | | | |
| --- | --- | --- | --- | --- | --- | --- | --- | --- | --- | --- | --- | --- | --- |
| | MD psi | SD % | CMD Value | SD | Ratio MD/ CMD | MD × $10^6$ psi | SD % | CMD × $10^6$ psi | SD % | Ratio MD/ CMD | MD % | SD % | CMD % | SD % |
| A* (0% silica) | 56461 | 25 | 5629 | 9 | 10.0 | 2 | 11 | 0.2 | 22 | 10.0 | | | 6.1 | 16 |
| B* (0% silica) | 20179 | 17 | 33015 | 18 | 0.6 | 0.86 | 7 | 0.85 | 21 | 1.0 | 3.1 | 16 | 8 | 55 |
| 40% fine | 19538 | 30 | 7142 | 7 | 2.7 | 0.76 | 30 | 0.37 | 6 | 2.1 | 5.5 | 24 | 4.8 | 23 |
| 40% coarse | 17297 | 11 | 5383 | 10 | 3.2 | 0.85 | 9 | 0.32 | 10 | 2.7 | 4.6 | 26 | 3.7 | 8 |
| 50% coarse | 9227 | 13 | 3682 | 10 | 2.5 | 0.62 | 10 | 0.28 | 12 | 2.2 | 3 | 17 | 2.2 | 9 |

*Comparative

As may seen from the above table, films comprising silica are surprisingly less sensitive to machine direction.

4. The circuit material of claim 1, wherein the composite further has a water absorption of less than about 0.1%.

5. The circuit material of claim 1, further comprising a first conductive layer disposed on one side of the composite layer.

6. The circuit material of claim 5, wherein the first conductive layer is copper.

7. The circuit material of claim 5, further comprising a second conductive layer disposed on a side of the composite layer opposite the first conductive layer.

8. The circuit material of claim 5, wherein the second conductive layer is copper.

9. A circuit, comprising
a dielectric substrate layer, wherein the dielectric substrate comprises
a liquid crystalline polymer,
a particulate filler composition comprising a combination of silica and polytetrafluoroethylene, and
a fibrous web; and
a circuit layer disposed on the dielectric substrate layer, wherein the circuit layer has a dielectric constant of less than about 3.8, a dissipation factor of less than about 0.007 measured between 1 and 10 GHz, and a UL-94 rating of V-1 or better.

10. The circuit of claim 9, wherein the circuit layer is copper.

11. The circuit of claim 9, further comprising a conductive layer disposed on a side of the dielectric substrate opposite the first circuit layer.

12. The circuit of claim 11, wherein the conductive layer is copper.

13. The circuit of claim 8, wherein the conductive layer is patterned to form a second circuit layer.

14. A multi-layer circuit comprising:
a first circuit, the first circuit comprising a first dielectric substrate layer and a first circuit layer;
a second circuit, the second circuit comprising a second dielectric substrate layer and a second circuit layer; and
a bond ply disposed between the first dielectric substrate layer and the second circuit layer; wherein at least one of the first dielectric substrate layer, the second dielectric substrate layer, or the bond ply comprises a liquid crystalline polymer, a particulate filler composition comprising a combination of silica and polytetrafluoroethylene, and a fibrous web; and further wherein the multi-layer circuit has a dielectric constant of less than about 3.8, a dissipation factor of less than or equal to about 0.007 measured between 1 and 10 GHz, and a UL-94 rating of V-1 or better.

15. The multi-layer circuit of claim 14, wherein the circuit layers are copper.

16. The multi-layer circuit of claim 14, further comprising a resin coated conductive layer comprising a first conductive layer disposed on a flowable dielectric material, wherein the flowable dielectric material is disposed on a side of the first circuit layer opposite the first dielectric substrate layer.

17. A circuit material comprising
a conductive layer; and
a layer of a liquid crystalline composite disposed on the conductive layer, the composite comprising
a liquid crystalline polymer,
a particulate filler composition, wherein the particulate filler composition comprises silica and polytetrafluoroethylene; and
a fibrous web;
wherein the bond strength between the conductive layer and the liquid crystalline composite layer is greater than or equal to about 1 pli measured at 200° C.

18. The circuit material of claim 17, wherein the silica is treated with a coupling agent that is a silane that bonds to the silica and to the liquid crystalline polymer.

19. A liquid crystalline composite, disposed on a conductive layer, the composite comprising
a liquid crystalline polymer;
a particulate filler composition, wherein the particulate filler composition comprises a combination of silica and polytetrafluoroethylene; and
a fibrous web,
wherein the bond strength between the conductive layer and the liquid crystalline composite layer is greater than or equal to about 1 pli measured at 200° C.

* * * * *